(12) United States Patent
Funahara et al.

(10) Patent No.: US 6,674,221 B2
(45) Date of Patent: Jan. 6, 2004

(54) ELECTRONIC COMPONENT MODULE AND PIEZOELECTRIC OSCILLATOR DEVICE

(75) Inventors: Toshikazu Funahara, Omihachiman (JP); Tadashi Kani, Kyoto (JP); Akiyoshi Moriyasu, Moriyama (JP); Makoto Fujita, Kustsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 270 days.

(21) Appl. No.: 09/738,051

(22) Filed: Dec. 15, 2000

(65) Prior Publication Data

US 2001/0015890 A1 Aug. 23, 2001

(30) Foreign Application Priority Data

Dec. 15, 1999 (JP) .......................................... 11-355534

(51) Int. Cl.[7] .......................................... H01L 41/053
(52) U.S. Cl. .................................................. 310/348
(58) Field of Search .................................. 310/344, 348

(56) References Cited

U.S. PATENT DOCUMENTS

| | | | | |
|---|---|---|---|---|
| 2,440,709 A | * | 5/1948 | Young | 310/314 |
| 4,985,687 A | * | 1/1991 | Long | 331/69 |
| 5,306,948 A | * | 4/1994 | Yamada et al. | 257/690 |
| 5,952,898 A | * | 9/1999 | Nakata et al. | 333/187 |
| 6,456,168 B1 | * | 9/2002 | Luff | 331/68 |

FOREIGN PATENT DOCUMENTS

| | | | | |
|---|---|---|---|---|
| JP | 6-302709 | 10/1994 | | H01L/23/02 |
| JP | 11-097819 | 4/1999 | | H05K/1/18 |

* cited by examiner

*Primary Examiner*—Thomas M. Dougherty
(74) *Attorney, Agent, or Firm*—Keating & Bennett, LLP

(57) ABSTRACT

A quartz oscillator is constructed to achieve a better yield when being mass-produced, by providing a margin of strength for each of the substrates thereof while reducing the thickness of the quartz oscillator devices. A box-shaped circuit substrate is provided for mounting thereon circuit components having different heights from one another. The bottom plate of a recess in this circuit substrate has a level difference, and is constituted of a region where the thickness of the bottom plate is relatively larger and a region where the thickness of the bottom plate is relatively smaller. High-profile circuit components are mounted on the region where the thickness of the bottom plate is smaller, while low-profile components are mounted on the region where the thickness of the bottom plate is larger. By thus increasing the thickness of one portion of the bottom plate of the circuit substrate, the bending strength of the circuit substrate is improved.

18 Claims, 5 Drawing Sheets

ELECTRONIC COMPONENT MODULE AND PIEZOELECTRIC OSCILLATOR DEVICE

BACKGROUND OF THE INVENTION

1. Field of the Invention

The present invention relates to an electronic component module wherein circuit components including an oscillation circuit are mounted on a circuit substrate, and the present invention also relates to a piezoelectric oscillator device including such an electronic component module.

2. Description of the Related Art

Portable telephone terminals now require miniaturization, and the quartz oscillator device for generating the reference oscillation signal used in the portable telephone terminal also requires a reduction in size and thickness. As the quartz oscillator device used in a conventional portable telephone terminal, a surface-mounting type structure as shown in FIG. 6, has been disclosed to meet such a request for reduction in the size and thickness. This quartz oscillator device 31 includes circuit components 33 including an oscillation circuit, a temperature compensation circuit, and other suitable components, are surface-mounted on a box-shaped circuit substrate 32 defined by ceramic multi-layered substrates, and wherein a quartz vibrator package 34 accommodating a quartz member is stacked on the circuit substrate 32 to define a lid.

In a quartz oscillator device as described above, in order to meet the request for reducing thickness and size, the depth of the recess in the circuit substrate is determined in accordance with the most high-profile component in the circuit components, and the thickness of the bottom plate is determined so as to have the minimum strength required. Also, by using the ceramic material having a high strength for a circuit substrate, the thickness of the bottom plate of the circuit substrate is reduced, and the overall thickness of the quartz oscillator device is reduced.

However, although the thickness of the quartz oscillator device can be reduced by reducing the thickness of the bottom plate of the recess in the circuit substrate, the thinner the bottom plate of the recess in the circuit substrate becomes, the lower the strength of the circuit substrate becomes. This causes the circuit substrate to be prone to cracking due to shock produced when circuit components are mounted thereon, or causes the circuit substrate to be prone to warping when the circuit substrate is baked. This reduces the yield of quartz oscillator devices when they are mass-produced.

SUMMARY OF THE INVENTION

To overcome the above-described problems, preferred embodiments of the present invention solve the problems with the above-described conventional art and greatly improve the yield when electronic component modules or piezoelectric oscillators are mass-produced, by providing a margin of strength for each of the substrates thereof while greatly reducing the thickness of the electronic component modules.

Preferred embodiments of the present invention provide an electronic component module including a circuit substrate, and a recess provided in the top surface of the circuit substrate, the recess being defined by a plurality of regions where the thicknesses of the bottom plates thereof differ from one another, and the recess including at least one portion where the circuit components are mounted on the circuit substrate.

In an electronic component module in accordance with preferred embodiments of the present invention, the bottom of the recess of the circuit substrate is defined by a plurality of regions where the thicknesses of the bottom plate thereof differ from one another. Hence, by mounting low-profile components on the region where the thickness of the bottom plate is larger, and by mounting high-profile circuit components on the region where the thickness of the bottom plate is smaller, the region where the thickness of the bottom plate is smaller is restricted to only the region that is actually required. This permits the thickness of the bottom plate of the recess to be partially thick, or permits the area of the region where the thickness of the bottom plate is smaller to be greatly reduced, which results in a greatly enhanced bending strength of the circuit substrate. Furthermore, the shock strength, and the mechanical-stress resistance in working processes of the circuit substrate is greatly improved, and enables the yield of electronic component modules to be greatly increased.

A preferred embodiment of the present invention provides an electronic component module including a plurality of recesses, each preferably having an insular shape on the top surface of the circuit substrate, and each accommodating a circuit component.

In an electronic component module in accordance with preferred embodiments of the present invention, since the recesses for accommodating circuit components include a plurality of islands, the space within the circuit substrate is greatly reduced, and even if the thickness of the bottom plate is decreased, the area of the portion where the thickness of the bottom plate is small, is greatly reduced. As a result, the bending strength, the shock strength, and the mechanical-stress resistance in working processes, of the electronic component module is greatly enhanced, and thereby the yield when electronic component modules are mass-produced is greatly improved.

Preferably, at least one portion of the plurality of recesses has a different depth from other recesses.

Moreover, in an electronic component module in accordance with a second preferred embodiment of the present invention, since the thickness of the bottom plate of the recess is determined in accordance with the height of each of the circuit components accommodated in the recess, the thickness of the bottom plate of the recess accommodating a low-profile circuit component is greatly increased. This permits the bending strength, the shock-resistance, and the mechanical-stress resistance in working processes of the circuit substrate is further enhanced.

Preferably, the top surfaces of the circuit components mounted in the recess is arranged to be substantially flush with the top surface of the circuit substrate.

Furthermore, in an electronic component module in accordance with the second preferred embodiment of the present invention, since the top surfaces of the circuit components are substantially flush with the top surface of the circuit substrate, wasted space over the circuit components is eliminated, and thereby the thickness of the bottom surface plate is greatly increased, and the overall thickness of the electronic component module is greatly reduced. Also, when circuit components are mounted face down, the top surfaces of the electrodes of all circuit components are substantially flush with one another. This facilitates the wiring of the circuit.

Other preferred embodiments of the present invention provide a piezoelectric oscillator including at least an oscillation circuit defined by the above described electronic component module, and including a vibrator package accommodating a piezoelectric member, the vibrator package is stacked on the electronic component module, and the vibrator package is thereby integrated with the electronic component module.

In an electronic component module in accordance with a preferred embodiment of the present invention, the thickness of the piezoelectric oscillator is greatly reduced by stacking an vibrator package on the electronic component module in accordance with a preferred embodiment of the present invention, and the bending strength, the shock strength and the mechanical-stress resistance in working processes of the piezoelectric oscillator are greatly enhanced, which results in a substantial improvement in the yield when the piezoelectric oscillators are mass-produced.

Meanwhile, the electronic component module is not limited to the circuit substrate on which the oscillation circuit of a piezoelectric oscillator is mounted. Any circuit substrate which has a circuit defined by a plurality of circuit components provided thereon may be used.

Other features, elements, characteristics and advantages of the present invention will become more apparent from the detailed description of preferred embodiments below with reference to the attached drawings.

DETAILED DESCRIPTION OF PREFERRED EMBODIMENTS

Figure 1:
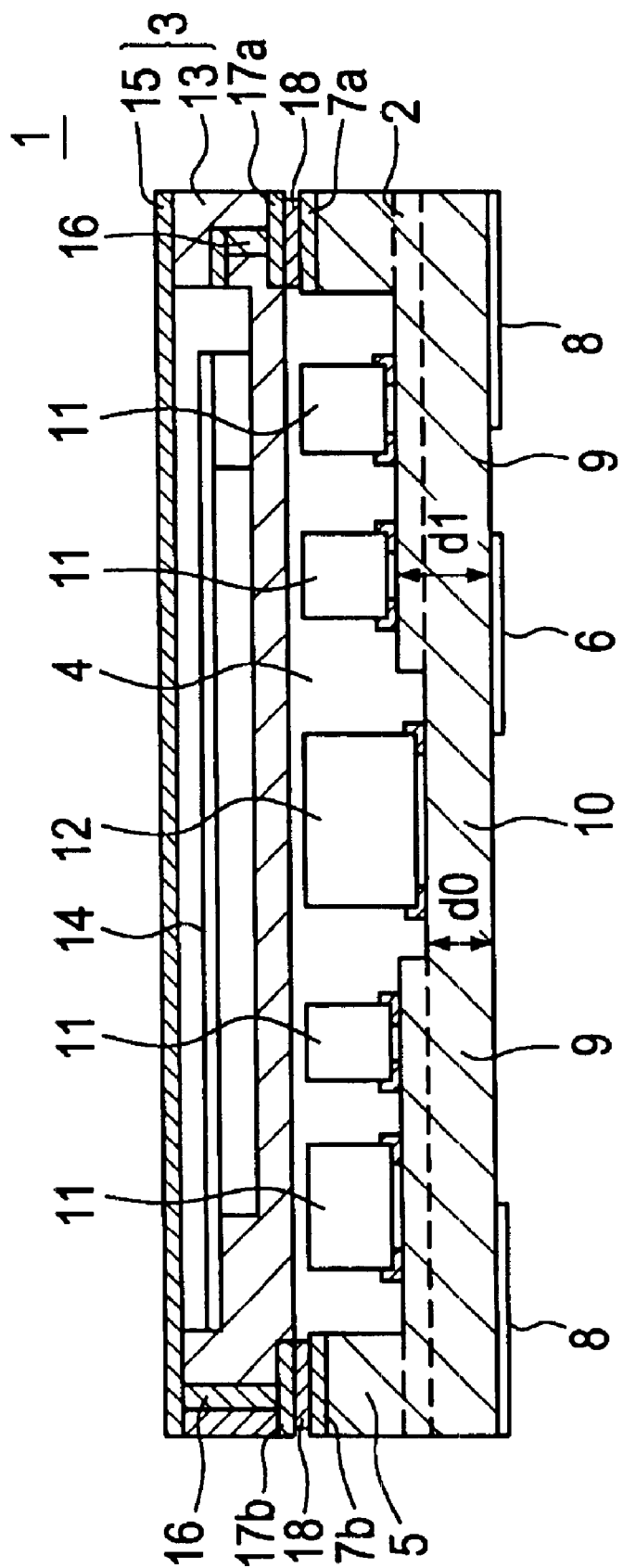
FIG. 1 is a cross sectional view showing a quartz oscillator device in accordance with a preferred embodiment of the present invention.
Figure 2:
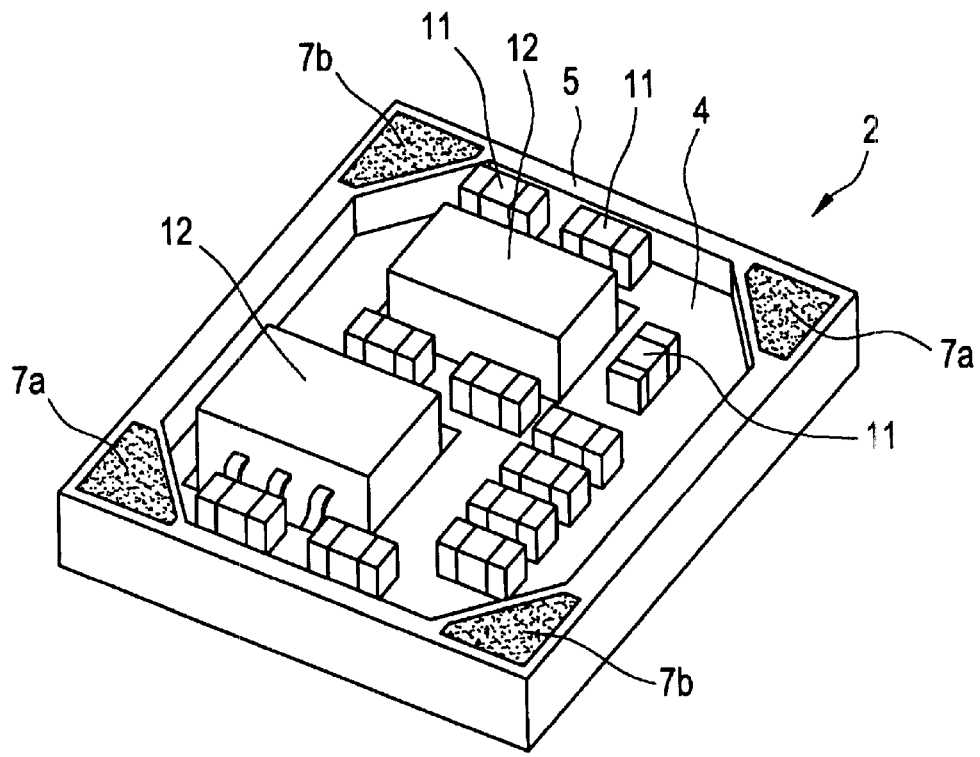
FIG. 2 is a perspective view illustrating a circuit substrate on which circuit components in the quartz oscillator device shown in FIG. 1 are mounted.

FIG. 1 is a cross sectional view showing a temperature compensation type quartz oscillator device 1 in accordance with a preferred embodiment of the present invention, and FIG. 2 is a perspective view illustrating a circuit substrate (electronic component module) on which circuit components are mounted. This quartz oscillator device 1 includes a surface-mounting type quartz vibrator package 3 (hereinafter referred to as a "quartz vibrator") which is integrally stacked on a box-shaped ceramic circuit substrate 2. By producing the quartz vibrator 3 separately from the circuit side, variations in the accuracy of the quartz vibrator 3 are greatly reduced and the frequency accuracy thereof is greatly increased. Also, by integrally stacking the quartz vibrator 3 on the circuit substrate 2, the quartz vibrator 3 also serves as a lid for the circuit substrate 2 having a box shape. This permits a reduction in the number of components and enables miniaturization of the quartz oscillator device 1.

Next, the configuration of the circuit substrate 2 will be described with reference to FIG. 2. The circuit substrate 2 is defined by a ceramic multi-layer substrate including a recess 4 provided at the approximate center thereof for mounting components, and a wall 5 projected therearound. Within the recess 4, wiring patterns (not shown) are provided and defined by thick-film conductors formed by the printing and baking of a conductor paste. Connection electrodes 7a and 7b are provided at the four corners on the top surface of the wall 5, and as shown in FIG. 1, external electrodes 8 are provided at the four corners on the bottom surface. The connection electrodes 7a and 7b on the top surface establish the connection with the quartz vibrator 3. Two electrodes 7a among the four connection electrodes on the top surface establish the connection with the terminal electrode of a quartz member 14, and the other two electrodes 7b establish the connection with a shielding plate 15 to define a ground electrode. The external electrodes 8 on the bottom surface define connection electrodes used when the quartz oscillator device 1 is surface-mounted on a printed circuit board or other suitable component. One of the four external electrodes defines a signal output, another is connected to a power-supply line, and the remaining two are connected to a ground line. Although not shown in the figures, the connection electrodes 7a and 7b, the external electrodes 8, and the wiring patterns are interconnected through embedded wiring and via-holes in the circuit substrate 2 having a multilayer structure. Also, metallic layers (not shown) for shielding are laminated within the circuit substrate 2.

On the circuit substrate 2, circuit components other than the quartz vibrator 3 are provided in the circuits defining the quartz oscillator device 1, such as an oscillation circuit, a temperature compensation circuit, a buffer amplifier circuit, or other suitable component. For this purpose, on the circuit substrate 2, surface-mounting type circuit components defining these circuits are preferably mounted by reflow soldering. For example, within the recess 4, transistors for oscillation and buffer amplification, a varicap diode, a chip-laminated capacitor, a chip thermistor for temperature compensation, chip resistors, and other suitable components are surface-mounted. On the bottom surface of the circuit substrate 2, a printing resistor 6 is provided, and the bottom surface of the circuit substrate 2 is covered by an insulating film except in the regions occupied by the external electrodes 8.

The top surface of the bottom plate in the recess of the circuit substrate 2 is an uneven surface having steps. In FIG. 1, the bottom is divided into two regions, that is, the high-profile region 9 where the thickness of the bottom plate is greater and the low-profile region 10 where the thickness of the bottom plate is smaller. However, the top surface of the bottom plate of the recess 4 may instead be provided with three or more steps. Among the circuit components, high-profile components 12 such as transistors and a diode are mounted in the low-profile region 10, and low-profile components 11 such as a chip-laminated capacitor and chip resistors are mounted in the high-profile region 9.

As shown in FIG. 1, when the top surface of the bottom plate of the recess 4 includes two steps, the circuit substrate 2 is formed by laminating three ceramic layers including the wall 5. Herein, the bottom plate in the low-profile region 10 (i.e., the smallest plate thickness) do has the smallest plate thickness for obtaining the required strength. The thickness of the bottom plate in the high-profile regions 9 $d_1$ (>$d_0$) is set so that the level difference ($d_1$–$d_0$) substantially equals the difference in the height between the high-profile components 12 and the low-profile components 11, and such that the height of the wall 5 is substantially equal to the heights of the low-profile components 11. Therefore, the top surfaces of the circuit components 11 and 12 are substantially flush with the top surface of the circuit substrate 2, and thereby wasted space is eliminated between the top surfaces of the circuit components 11 and 12 and the bottom surface of the quartz vibrator 3 (Conventionally, since the thickness of the bottom plate in the circuit substrate is reduced, unnecessary spaces are provided even over the low-profile components).

In the regions 9 where the low-profile components 11 are mounted, since the thickness of the bottom plate has a margin of thickness by $(d_1-d_0)$ with respect to the smallest thickness $d_0$, and the area of the region 10 where the plate thickness is small is greatly reduced, and hence the bending strength of the circuit substrate 2 is greatly enhanced without increasing the thickness of the circuit substrate 2.

Next, as illustrated in FIG. 1, the quartz member 14 is accommodated in a case 3 having an open top surface, and is supported at both ends thereof by the case 13. The entire top surface of the case 13 is covered by a shielding plate 15, and the quartz 14 is hermetically sealed in a package defined by the case 13 and the shielding plate 15. At the four corners of the case 13, electrodes 17a and 17b are provided. Two electrodes 17a among the four electrodes are connected to the terminal electrode of the quartz member 14 through via-holes 16, and the other two electrodes 17b are conducted to the shielding plate 15 through via-holes 16.

The connection electrode 7a on the top surface of the circuit substrate 2 and the electrode 17a on the bottom surface of the quartz vibrator 3 are reflow-soldered, and the connection electrode 7b on the top surface of the circuit substrate 2 and the electrode 17b on the bottom surface of the quartz vibrator 3 are also reflow-soldered. The connection electrode 7a and 7b on the top surface of the circuit substrate 2, and the electrode 17a and 17b on the bottom surface of the quartz vibrator 3 are thereby connected together via solder 18, and the circuit substrate 2 and the quartz vibrator 3 are mechanically joined.

As described above, in this quartz oscillator device 1, the bending strength of the circuit substrate 2 is enhanced by increasing the plate thickness at one portion of the bottom surface of the circuit substrate 2 and by decreasing the area of the region where the plate thickness is the smallest, and hence, when circuit components are subjected to mounting, and when thick-film printing is performed with respect to the circuit substrate 2, the strength of the circuit substrate 2 during transferring is increased, and the occurrence of cracking thereof decreased. Also, when the circuit substrate 2 is defined by the ceramic multi-layer method wherein ceramic green sheets are laminated and sintered, the occurrence of deformation the circuit substrate, such as warping or waviness is greatly reduced.

Furthermore, by disposing together a group of circuit components having substantially the same height, for example, a group of low-profile components 11 or a group of high-profile components, the unevenness of the top surface of the bottom plate in the circuit substrate 2 is minimized.

Figure 3:
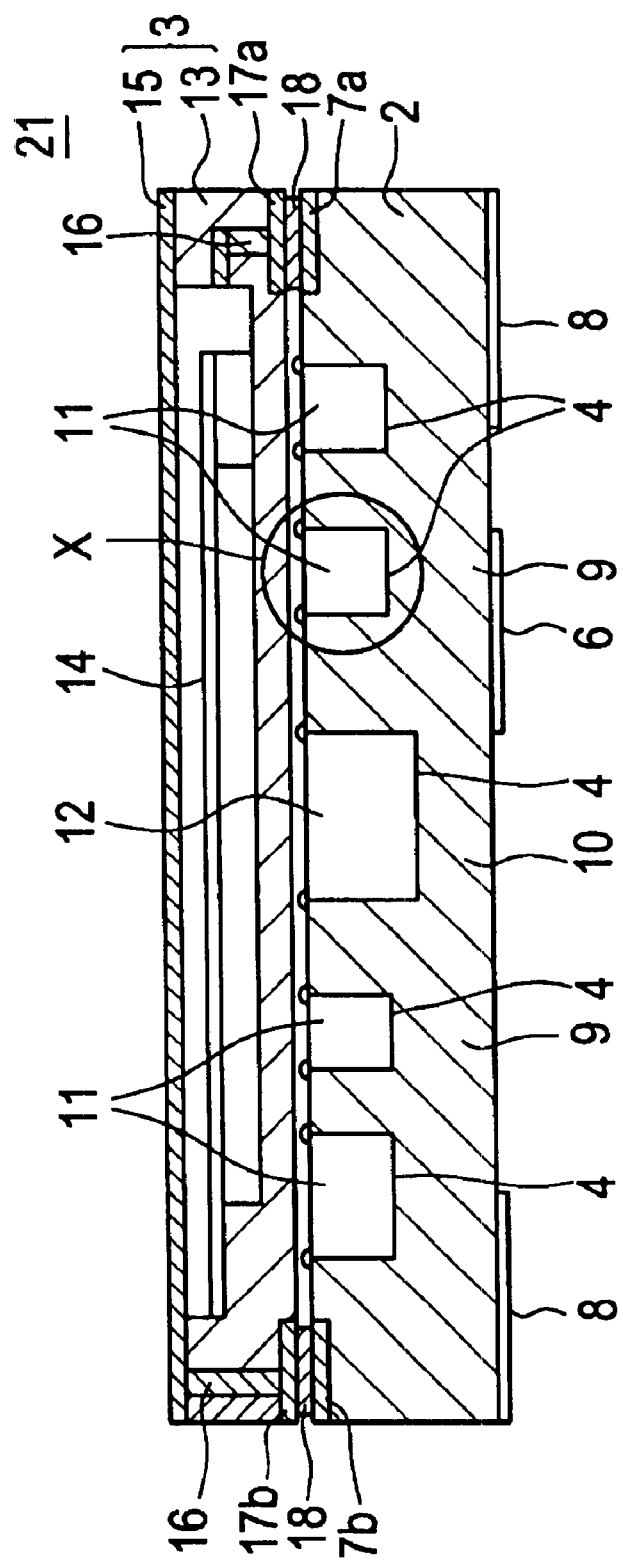
FIG. 3 is a cross sectional view showing a quartz oscillator device in accordance with another preferred embodiment of the present invention.
Figure 4:
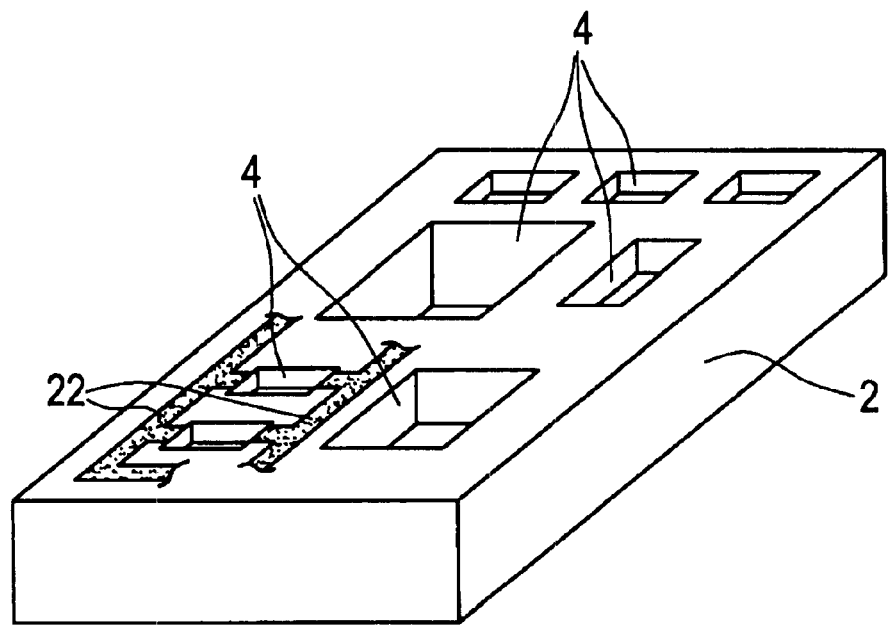
FIG. 4 is a schematic perspective view showing the circuit substrate used in the quartz oscillator device shown in FIG. 3.
Figure 5:
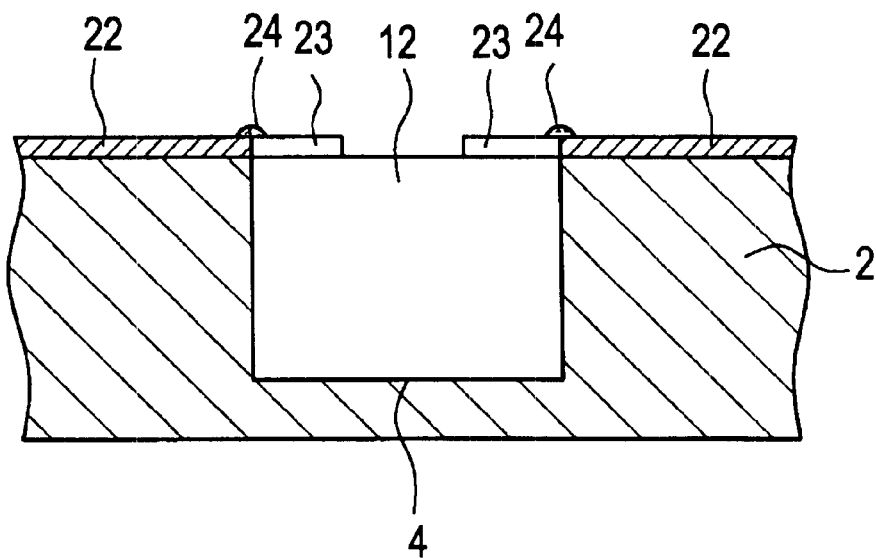
FIG. 5 is a enlarged view of the portion X shown in FIG. 3.
Figure 6:
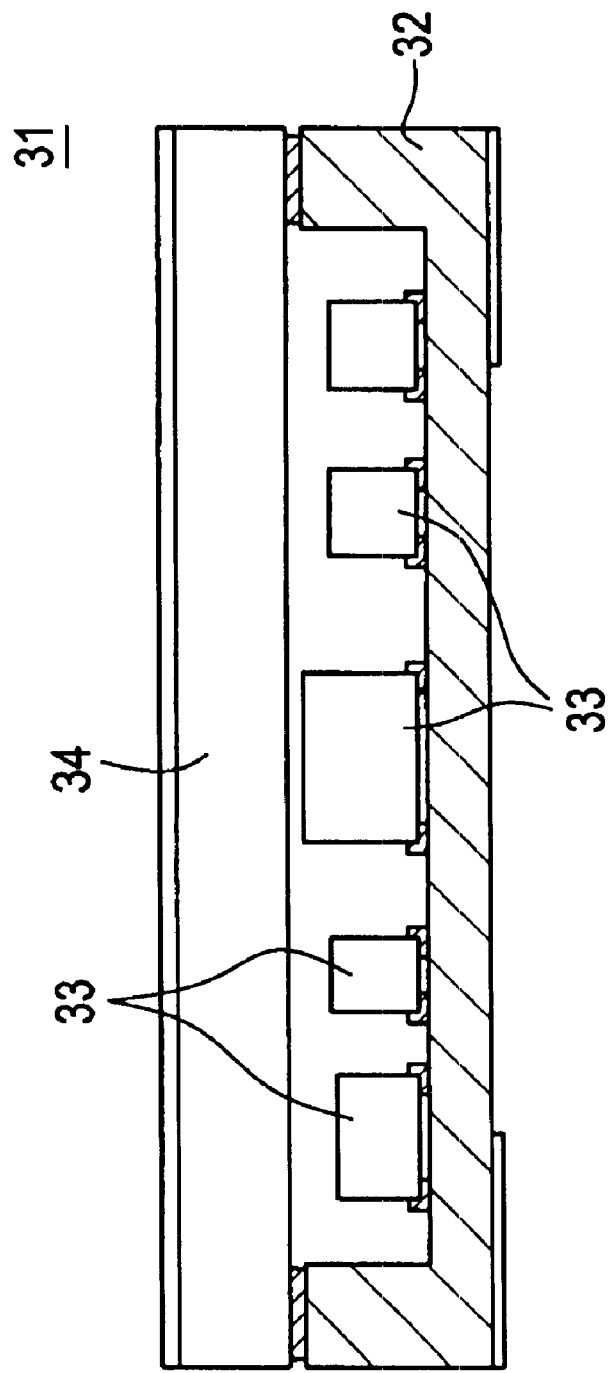
FIG. 6 is a partially broken cross sectional view showing the structure of a conventional quartz oscillator device.

FIG. 3 is a cross sectional view showing a quartz oscillator device 21 in accordance with another preferred embodiment of the present invention, FIG. 4 is a perspective view showing the circuit substrate 2 used in this quartz oscillator device 21, and FIG. 5 is a enlarged view of the portion X shown in FIG. 3. As illustrated in FIG. 4, in the circuit substrate 2 of this preferred embodiment, a plurality of recesses are configured into island shapes in accordance with the area and depth of the circuit components 11 and 12 to be mounted. While orienting the electrodes of the circuit components upward, circuit components 11 and 12 are individually accommodated face down in the recesses. On the top surface of the circuit substrate 2, wiring patterns (in FIG. 4, only one portion of wiring patterns is shown) are provided by thick-film conductors. As illustrated in FIG. 5, the wiring patterns 22 and the electrode 23 of the circuit components 11 and 12 are bonded by solder 24, on the top surface of the circuit substrate 2.

In the quartz oscillator device 21 having the above-described structure, since the space between all circuit components 11 and 12 are eliminated and filled with the circuit substrate 2, the bending strength of the circuit substrate 2 is significantly improved. Moreover, since the depths of all recesses 4 are in accordance with the heights of the circuit components 11 and 12, the thicknesses of the bottom plate under the low-profile components 11 is increased, and the strength of the circuit substrate 2 is greatly enhanced. Also, since the top surfaces of all circuit components and the top surface of the circuit substrate 2 are substantially flush with one another, soldering between the wiring patterns 22 and the electrode 23 is greatly facilitated.

In this preferred embodiment, the strength against the shock when circuit components are mounted, the mechanical-stress resistance, and the strength against the shock when thick-film printing is performed are greatly enhanced, and thereby the yield of the quartz oscillator device 1 is greatly improved.

The type of a quartz oscillator device used is not particularly limited. For example, as described above, a temperature compensation quartz oscillator device (TCXO) may used, or a quartz oscillator device without temperature compensation (SPXO) may be used. Alternatively, a voltage control quartz oscillator (VCXO) may also be used.

As is evident from the above-described description, in accordance with the electronic component module of various preferred embodiments of the present invention, it is possible to enhance the bending strength of the circuit substrate, and to increase the shock strength or the mechanical-stress resistance in working processes, which results in a substantial improvement in the yield of electronic component modules.

This electronic component module can be used for, for example, a piezoelectric oscillator, and permit the bending strength or the shock strength of the piezoelectric oscillator to be greatly improved.

While preferred embodiments of the present invention have been described, it is to be understood that modifications will be apparent to those skilled in the art without departing from the scope and spirit of the invention.

What is claimed is:

1. An electronic component module comprising:
    a circuit substrate having circuit components mounted thereon: and
    a recess provided in the top surface of said circuit substrate, said recess including a plurality of regions where the thicknesses of bottom plates of said recess differ from one another and said recess including at least one portion of the circuit components mounted on said circuit substrate; wherein
    said circuit substrate includes a wall surrounding said recess, and connection electrodes are provided at four corners on a top surface of the wall.

2. An electronic component module as claimed in claim 1, wherein the top surface of each of the circuit components mounted in said recess is substantially flush with the top surface of said circuit substrate.

3. An electronic component module as claimed in claim 1, wherein said circuit components define a quartz vibrator package.

4. An electronic component module as claimed in claim 1, wherein said circuit substrate is a ceramic circuit substrate.

5. An electronic component module as claimed in claim 1, wherein said circuit substrate is defined by a ceramic multi-layer substrate.

6. An electronic component module as claimed in claim 1, wherein said connection electrodes are arranged to define a connection with the circuit components.

7. A piezoelectric oscillator comprising:
- at least oscillation circuit including an electronic component module as claimed in claim 1, and
- a vibrator package accommodating a piezoelectric member, said vibrator package being stacked on said electronic component module, and said vibrator package being integrated with said electronic component module.

8. A piezoelectric oscillator according to claim 7, wherein said vibrator package includes a case having an open top surface, said electronic component module being supported at both end portions thereof by said case.

9. A piezoelectric oscillator according to claim 8, further comprising a shielding plate, wherein the entire top surface of the case is covered by the shielding plate, such that said electronic component module is hermetically sealed in said vibration package defined by the case and the shielding plate.

10. An electronic component module comprising:
- a circuit substrate; and a plurality of recesses disposed on the top surface of the circuit substrate, and each of said plurality of recesses accommodating a circuit component; wherein
- said circuit substrate includes a wall surrounding said recess, and connection electrodes are provided at four corners on a top surface of the wall.

11. An electronic component module as claimed in claim 10, wherein at least one of said plurality of recesses has a different depth than the remainder of said plurality of recesses.

12. An electronic component module as claimed in claim 10, wherein the top surface of each of the circuit components mounted in said recess is substantially flush with the top surface of said circuit substrate.

13. An electronic component module as claimed in claim 10, wherein said circuit components define a quartz vibrator package.

14. An electronic component module as claimed in claim 10, wherein said circuit substrate is a ceramic circuit substrate.

15. An electronic component module as claimed in claim 13, wherein said connection electrodes are arranged to be connected with the circuit components.

16. A piezoelectric oscillator comprising:
- at least one oscillation circuit including an electronic component module as claimed in claim 10, and
- a vibrator package accommodating a piezoelectric member, said vibrator package being stacked on said electronic component module, and said vibrator package being integrated with said electronic component module.

17. A piezoelectric oscillator according to claim 16, wherein said vibrator package includes a case having an open top surface, said electronic component module being supported at both end portions thereof by said case.

18. A piezoelectric oscillator according to claim 17, further comprising a shielding plate, wherein the entire top surface of the case is covered by the shielding plate, such that said electronic component module is hermetically sealed in said vibration package defined by the case and the shielding plate.

* * * * *